United States Patent

[15] 3,701,034
[45] Oct. 24, 1972

Bruene

[54] EQUALIZER CIRCUIT FOR MULTISTAGE FEEDBACK AMPLIFIER

[72] Inventor: Warren B. Bruene, Dallas, Tex.

[73] Assignee: Collins Radio Company, Dallas, Tex.

[22] Filed: March 23, 1971

[21] Appl. No.: 127,214

[52] U.S. Cl. ....................330/28, 330/107, 330/109
[51] Int. Cl. ....................H03f 1/08
[58] Field of Search ............330/28, 107, 109, 21, 31

[56] References Cited

UNITED STATES PATENTS

| | | | |
|---|---|---|---|
| 2,123,178 | 7/1938 | Bode | 330/107 X |
| 2,033,963 | 3/1936 | Ware | 330/107 |
| 1,915,440 | 6/1933 | Nyquist | 330/107 X |
| 2,178,072 | 10/1939 | Fritzinger | 330/107 X |
| 2,210,503 | 8/1940 | Shaw | 330/107 X |
| 2,223,161 | 11/1940 | Anderson | 330/107 |

*Primary Examiner*—Roy Lake
*Assistant Examiner*—James B. Mullins
*Attorney*—Henry K. Woodward and Robert J. Crawford

[57] ABSTRACT

Stability of a three stage amplifier is improved by providing a feedback loop from the amplifier output to the amplifier input, and including a compensating circuit in the loop which tends to offset phase shift of one coupling circuit in the amplifier. Mixer means is provided for mixing the feedback signal with the input signal.

8 Claims, 6 Drawing Figures

INVENTOR
WARREN B. BRUENE
BY H. K. Woodward
ATTORNEY

INVENTOR
WARREN B. BRUENE
BY H. K. Woodward
ATTORNEY

EQUALIZER CIRCUIT FOR MULTISTAGE FEEDBACK AMPLIFIER

This invention relates generally to electrical amplifiers, and more particularly to a feedback arrangement for improving the stability of a multistage amplifier.

An object of the invention is a stable multistage amplifier.

Another object of the invention is a three stage feedback amplifier having improved stability when operating into a high Q load.

A feature of the invention is feedback circuit means in combination with a multistage amplifier and including provision for offsetting the signal phase shift occurring in one stage of the amplifier.

Other objects and features of the invention will be apparent from the following description and appended claims when taken with the drawings, in which:

Figure 1:
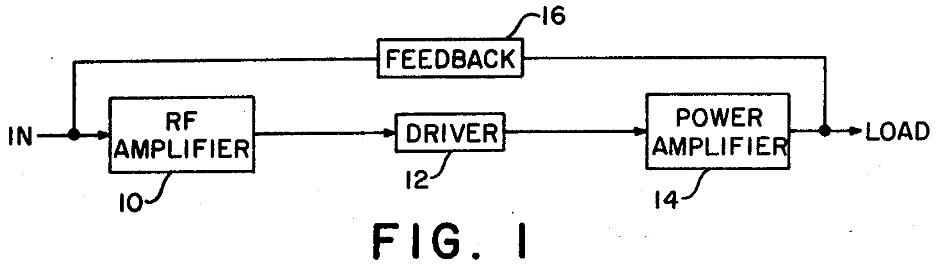
FIG. 1 is a block diagram of a three stage amplifier in which the present invention is applicable.

Referring now to the drawings, FIG. 1 is a block diagram of a three stage feedback amplifier. Typically, such an amplifier includes a first stage RF amplifier 10, a second stage driver amplifier 12, and a third stage power amplifier 14. To alleviate amplitude and phase distortion in the amplifier circuits, typically a feedback path 16 is provided between the output of the power amplifier and the input to the RF amplifier 10. While the feedback circuit may be provided for only the last two stages of the amplifier, it is generally advantageous to include as many stages as practical within the feedback loop.

Three stage amplifier feedback is discussed in Chapter 13 on Distortion Reduction of Pappenfus, Bruene, and Schoenike, *Single Sideband Principles and Circuits*, McGraw-Hill 1964. Beginning at page 199, Pappenfus et al. discuss the problems encountered with signal distortion in three stage feedback. Since three tuned circuits contribute to the phase-gain characteristic of a feedback loop, it is not possible to use as much feedback for a given stability margin as with two stage feedback. One three stage RF network circuit which has been successfully used is illustrated on page 200.

Figure 2:
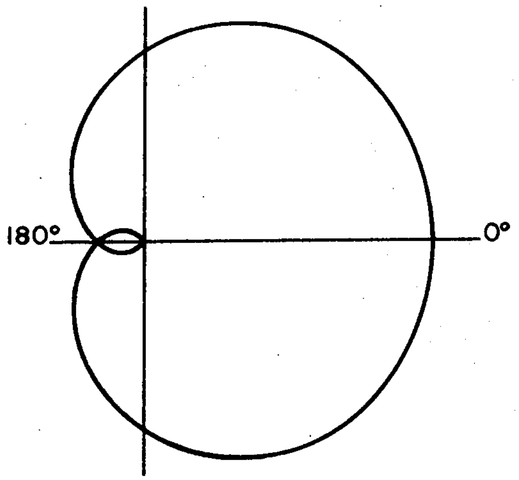
FIG. 2 is a Nyquist plot for a conventional three stage amplifier with feedback.

As discussed further in Pappenfus et al., beginning with page 207, the phase-gain characteristic of a three stage feedback amplifier may be represented by a Nyquist plot such as shown in FIG. 2 herein. It will be noted from the Nyquist plot that the three stages, each contributing up to 90° of phase shift, can produce a total of up to 270° of phase shift as operating frequency varies from resonant frequency, thus producing an increment of regenerative feedback at 180° phase shift. So long as the total feedback is limited, the feedback component at 180° is insufficient to cause self oscillation or ringing in the amplifier circuit.

As further discussed by Pappenfus et al beginning at page 209, a high Q antenna circuit, such as a whip antenna, may detrimentally affect the phase-gain characteristic of a three-stage feedback amplifier and hence the feedback loop stability. Such an instability problem is in fact encountered with high gain antennas thus limiting the applicability of three-stage feedback to such loads.

Figure 3:
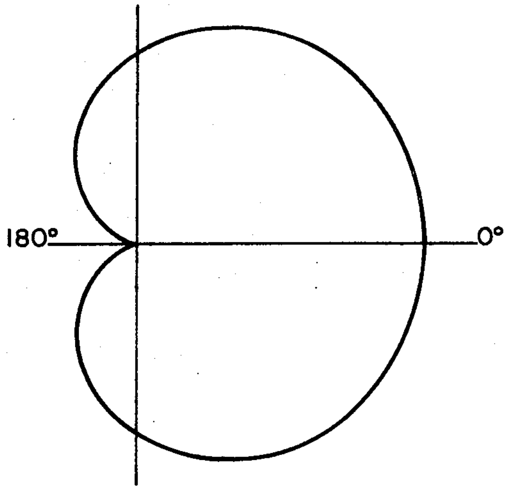
FIG. 3 is a Nyquist plot of a three stage amplifier with a feedback arrangement in accordance with the present invention.

In accordance with the present invention, a feedback arrangement is provided which alleviates the problem of instability of three-stage feedback amplifiers, especially when working into a high Q load. In effect, applicant provides means in the feedback circuit which produces a phase shift that effectively counteracts the phase shift attributed to one stage of the amplifier, thereby reducing the maximum amplifier phase shift from 270° to approximately 180°. This is illustrated in the Nyquist chart illustrated in FIG. 3. It will be noted in this chart that the gain around the feedback loop is near zero at 180° thus avoiding the possibility of self oscillation in the circuit.

One such arrangement for providing this offsetting phase shift in the feedback loop is the provision of a tuned circuit in the loop of the same configuration as an interstage tank circuit of the amplifier. The two tuned circuits produce the same amount of phase shift with frequency, but the respective positions of the tuned circuits in the amplifier circuit have opposing and thus canceling effects.

Figure 4:
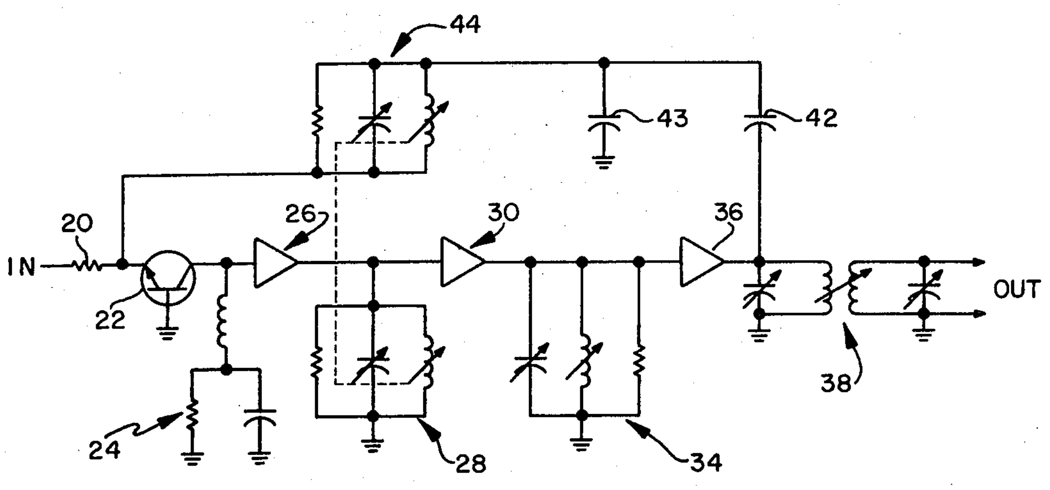
FIG. 4 is a schematic diagram of one embodiment of a three stage feedback amplifier in accordance with the present invention.

FIG. 4 is a schematic diagram of a 50 KW, three stage feedback amplifier designed to operate in the high frequency range (2–30 megahertz), and including a feedback loop in accordance with the present invention. The input to the amplifier is applied through resistor 20 to a mixer stage comprising transistor 22 which mixes the input signal with a feedback signal.

The output signal of mixer 22 is applied to the RF amplifier 26 which, in turn, is connected through coupling circuit 28 to the driver stage 30. Similarly, driver 30 is connected through a second coupling circuit 34 to power amplifier 36. The output of the amplifier is taken through tuned circuit 38.

Feedback is coupled from the output of amplifier 36 to mixer 22 through voltage divider capacitors 42 and 43 and compensating network 44. Network 44 in the feedback loop is designed to have a phase function which compensates substantially for broadband interstage circuit 28 and is ganged therewith so that tuning of circuit 28 similarly tunes network 44. Thus, while coupling circuits 28, 34, and 38 each may contribute up to 90° of phase shift to the amplified signal, compensating network 44 in the feedback path offsets the phase shift of interstage circuit 28 thus effectively reducing the maximum phase shift to approximately 180°.

Figure 5:
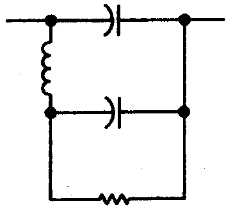
FIGS. 5 and 6 are schematics of a broadband compensating circuit and a broadband coupling circuit, respectively, in accordance with the invention.
Figure 6:
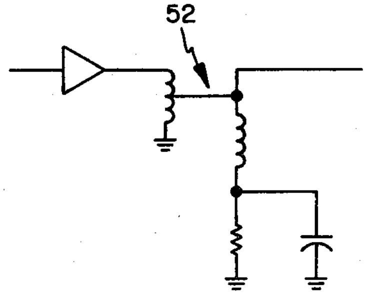

In the circuit shown in FIG. 4, the compensating network 44 is identical with coupling circuit 28, the phase shift of which is compensated by network 44. However, the two circuits need not be identical or tuned in order to accomplish the phase shift compensation in accordance with the invention. FIGS. 5 and 6 are a broadband compensation circuit and coupling circuit, respectively, employed in another embodiment of the invention. In this embodiment, a two-to-one transformer 52 is provided in the coupling circuit of FIG. 6 to present a higher impedance at the plates of two preceding input amplifiers, operating in parallel, while still absorbing the capacitance of the grid of the driver tube. The broadband compensating circuit shown in FIG. 5 provides sufficiently close tracking of phase shift, when the two circuits are employed in a 3 KW HF amplifier, to provide circuit stability over the operating frequency range.

While the invention has been described with reference to specific embodiments, the description is illustrative and is not to be considered as limiting the invention. Various modifications and changes may occur to those skilled in the art without departing from the spirit and scope of the invention as defined by the appended claims.

I claim:

1. A three-stage feedback amplifier tunable over a wide frequency range comprising an RF amplifier stage, a driver stage, and a power stage, each of said three stages connected to and driven into a respective coupling circuit, each of said coupling circuits exhibiting a reactance component which effects a phase shift in an amplifier signal, said phase shifts being cumulative and exceeding 180° in maximum cumulative phase shift, a feedback loop connected between the output and input of said amplifier, a compensating network in said feedback loop exhibiting a phase shift characteristic substantially equal to the phase shift characteristic of one of said coupling circuits and effectively reducing maximum cumulative phase shift thereby maintaining stability of said amplifier, and transistor mixing means for mixing the feedback signal with the input signal.

2. A three-stage amplifier as defined by claim 1 wherein said compensating circuit includes a tuned circuit of similar design as said one coupling circuit and is ganged therewith for simultaneous tuning.

3. A three-stage amplifier as defined by claim 2 wherein said tuned circuit of said compensating circuit comprises part of a voltage divider in said feedback loop.

4. A three stage amplifier as defined by claim 1 wherein said compensating circuit comprises a broadband circuit.

5. In a three-stage amplifier including coupling circuits in each of said stages each exhibiting a phase shift characteristic, means for stabilizing operation of said amplifier comprising a feedback loop connected between the output and the input of said amplifier, said feedback loop including a compensating network exhibiting a phase shift characteristic substantially equal to the phase shift characteristic of one of said coupling circuits and effectively canceling the phase shift of one of said coupling circuits, and transistor mixing means for mixing the feedback signal with the input signal.

6. Means for stabilizing operation as defined by claim 5 wherein said compensating circuit includes a tuned circuit of similar design as said one coupling circuit, and is ganged therewith for simultaneous tuning.

7. Means for stabilizing operation as defined by claim 6 wherein said tuned circuit of said compensating circuit comprises part of a voltage divider in said feedback loop.

8. Means for stabilizing operation as defined by claim 5 wherein said compensating circuit comprises a broadband circuit.

* * * * *